United States Patent [19]
Smith
[11] 3,755,753
[45] Aug. 28, 1973

[54] BROADBAND SOLID STATE AMPLIFIER

[75] Inventor: Burton H. Smith, Lexington, Mass.
[73] Assignee: Raytheon Company, Lexington, Mass.

[22] Filed: Dec. 21, 1971
[21] Appl. No.: 210,454

[52] U.S. Cl. .................................. 330/53, 330/61 A
[51] Int. Cl. .................................................. H03f 3/60
[58] Field of Search .............................. 330/61 A, 53

[56] References Cited
UNITED STATES PATENTS

| | | | |
|---|---|---|---|
| 3,187,266 | 6/1965 | Marshall, Jr. | 330/61 A X |
| 3,646,467 | 2/1972 | Smith | 330/61 A X |
| 3,491,310 | 1/1970 | Hines | 330/61 A |
| 3,457,528 | 7/1969 | Ingerson | 330/61 A |
| 3,445,778 | 5/1969 | Gerlach | 330/61 A |
| 3,619,801 | 11/1971 | Hughes | 330/61 A X |

*Primary Examiner*—Nathan Kaufman
*Attorney*—Harold A. Murphy, Edgar O. Rost et al.

[57] ABSTRACT

A plurality of solid state devices exhibiting negative resistance characteristics in the nonoscillating state are positioned in parallel at periodic intervals along an electro-magnetic energy transmission line so as to provide a negative propagation constant to effect a high gain broadband amplifier. Sections of devices with the total number increasing within subsequent sections and reverse wave limitation means together with suitable impedance matching means complete the device. Both rectangular and coaxial waveguide transmission line configurations are described.

6 Claims, 4 Drawing Figures

PATENTED AUG 28 1973 3,755,753

BROADBAND SOLID STATE AMPLIFIER

BACKGROUND OF THE INVENTION

The invention relates to solid state amplifiers and, more particularly, to means for combining larger numbers of semiconductor diodes in a high gain broadband structure.

The generation of high frequency electromagnetic energy utilizing bulk-effect and avalanche semiconductor devices having negative resistance characteristics has become an important solid state source of such energy in the art. The term "bulk-effect" is defined as diodes having an active region of bulk semiconductor material and operate without a *p-n* junction in either a domain or LSA mode. The term "avalanche" refers to diodes using *p-n*, *p-i-n* or Schottky junctions which operate in two basic modes, namely, Impatt and Trappatt. The applicable sources are capable of generating moderate level electromagnetic energy when operated as oscillators in relatively narrow bandwidth resonant structures. The evolution in the art from the generation and/or amplification of energy with vacuum tubes to solid state devices has been somewhat hampered by the peak and average power capabilities of the later in either pulsed or continuous wave operation. The dissipation of thermal energy due to the high current densities and losses contributes measurably to the overall limitations in the use of such solid state devices. When large numbers of negative resistance devices are employed in parallel and/or series cascade arrays to generate high power energy within resonant circuits, the electrical phase of the output energy must be controlled with the matching of the impedances along the transmission structure.

New and novel structures and systems of combining larger numbers of negative resistance devices are, therefore, required to provide higher power levels by suitably raising the power gain factors within an array of such sources within the framework of the electrical and mechanical limitations of the solid state materials.

SUMMARY OF THE INVENTION

A plurality of periodically spaced nonoscillating solid state diodes are suitably DC biased to provide a nonresonant transmission structure having substantially negative propagation constant. Sections of a compote transmission structure are isolated from succeeding sections by nonreciprocal reverse wave limitation means such as multiport ferrite circulators and are intercoupled by suitable impedance matching means. All the sections are combined and coupled to an output utilization load. The teachings of the invention apply equally to coaxial type waveguide structures as well as the rectangular type. The DC biasing means are suitably isolated from the electromagnetic energy propagating along the transmission line.

BRIEF DESCRIPTION OF THE DRAWINGS

The invention, as well as the details for the provisions of illustrative embodiments, will be readily understood after consideration of the following detailed specification and reference to the accompanying drawings, wherein.

DESCRIPTION OF PREFERRED EMBODIMENTS

Figure 1:
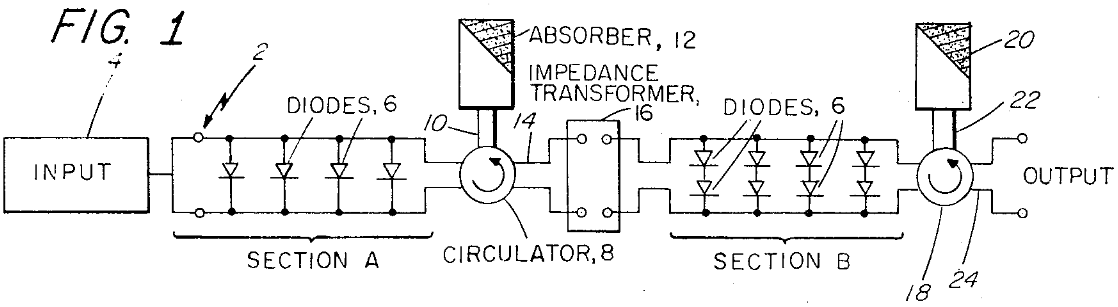
FIG. 1 is a schematic circuit diagram of the embodiment of the invention.

Referring now to FIG. 1 the embodiment of the invention comprises a nonresonant transmission line 2 having input electromagnetic energy source means 4 coupled thereto. The transmission line in section A is provided with a plurality of negative-resistance diode devices 6 suitably DC reverse-biased of the bulk-effect or avalanche type arranged electrically in parallel at spaced periodic intervals along the structure. In accordance with the invention the diodes are maintained in the nonoscillating state and illustratively, a quenched Gunn device would satisfy this requirement.

The downstream or output end of the transmission line of the section A is terminated by a multi-port solid state nonreciprocal circulator 8 having port 10 connected to a suitable load 12 of a lossy energy absorbing material. The ciruclator may be fabricated of a ferrimagnetic material and substantially limits the propagation of any energy in the reverse direction. Port 14 of circulator 8 is coupled by suitable impedance matching means such as a transformer 16 to the succeeding section B having a larger number of diode devices 6 disposed in parallel across the transmission line 1. In the illustration, pairs of diode devices have been arranged in series in each parallel array within the section B. The diodes are positioned within each section at periodic intervals with the overall bandwidth of the combined device and system limited only by the stop bands introduced by reason of the periodicity of the diode devices. Subsequent sections having a successively larger number of diode devices may be cascaded to provide a high power output limited only by the power handling capabilities of each of the diode devices.

The output of the section B transmission line is terminated in another circulator device 18 having a load 20 coupled to port 22. The output part 24 of circulator 18 is illustratively coupled by suitable means to a utilization load.

In accordance with the teachings of the present invention, the solid state diodes are operated to display negative-resistance characteristics across a nonresonant transmission line of such magnitude that the propagation constant of the line becomes negative causing gain rather than decay by attenuation of electromagnetic energy propagating along the line. Next, it is necessary in order to achieve a high power capability at the output end of the device that the transmision line characteristic impedance be described and the number of diodes be increased in successive stages along the line. Additionally, the solid state devices employed in the practice of the invention must exhibit the negative-resistance characteristic without oscillating.

Figure 2:
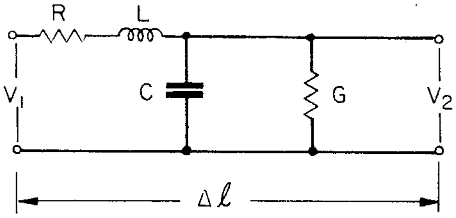
FIG. 2 is an equivalent electrical circuit diagram of a predetermined length of transmission line embodying the invention.

To assist in an understanding of the invention, although by no means is this explanation exclusive, reference is now directed to FIG. 2 and a discussion of certain general principles of electrical circuits. The equivalent circuit for an incremntal length, $\Delta l$ ; of a diodeloaded transmission line may be represented in accordance with elementary transmission line theory by the components R indicating the series resistance of the line, G indicating the shunt admittance, L indicating the line inductance and C indicating capacitance. The propagation characteristics along the transmission line may be derived from the following equation:

$$V_2 = V_1 e^{-\alpha \Delta l} \quad (1)$$

for $V_1$ indicating the output and $V_2$ indicating the next point of measurement. In this equation $\alpha$ is difined by the relation:

$$\alpha = (R/2Z_o + (GZ_o/Z) \quad (2)$$

The transmission line characteristic impedance is given by the equation:

$$Z = \sqrt{(L/C)}\,[1 + j\,[G/2WC] - [R/2WL]] \quad (3)$$

The conditions under which the high gain for amplification will occur are when $\alpha$ is negative or:

$$\left|(-GZ_o/2)\right| > (R/2Z_o) \quad (4)$$

where the negative sign implies that the net shunt conductance is negative. With the provision of a transmission structure having a negative propagation constant rather than the usual positive value that results in decaying propagation in a normally passive transmission line, an amplifier is provided having substantial gain and broadband capabilities. The addition of numerous solid state diode devices in each cascaded section of the overall amplifier device will yield significant power levels comparable to prior art vacuum devices with only limitations of space and thermal dissipation controlling the ultimate power handling capability.

Figures 3, 4:
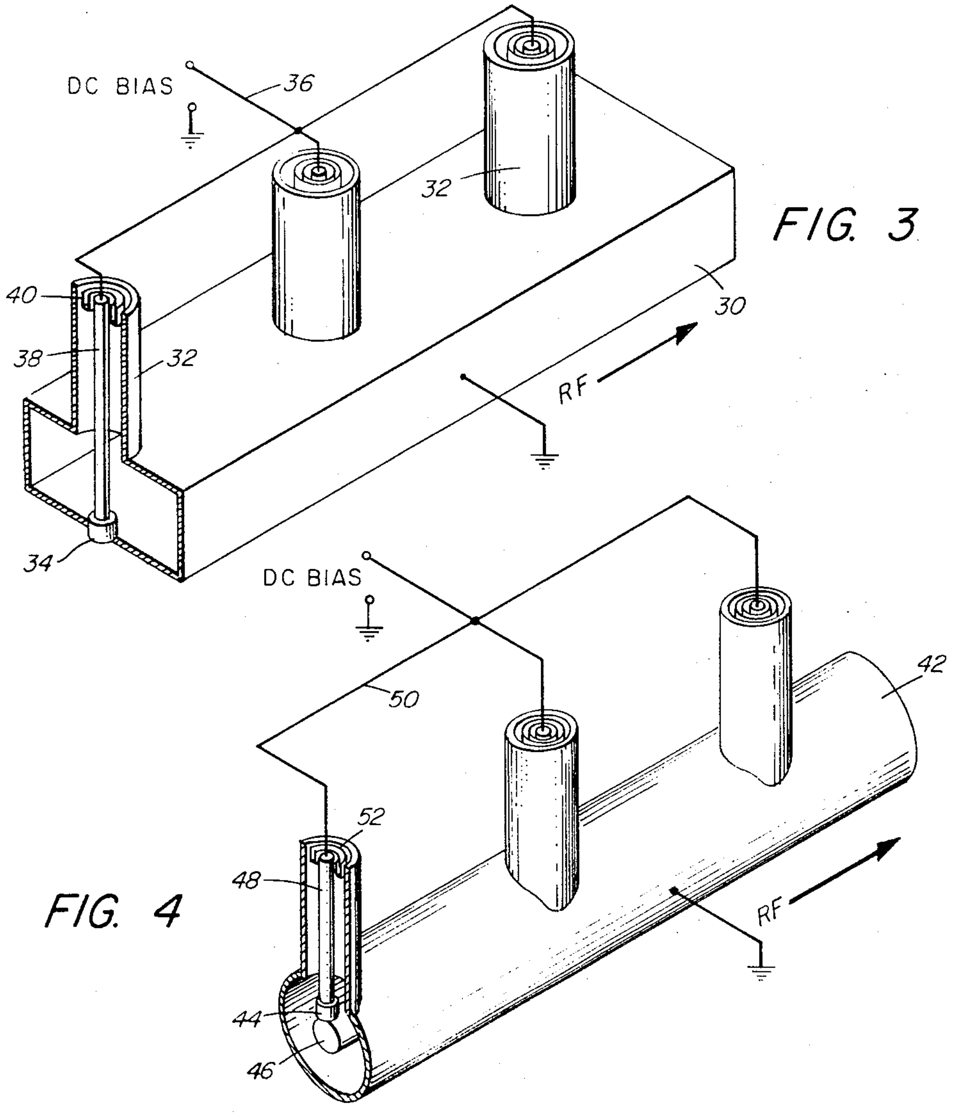
FIG. 3 is an isometric view, partly in section, of the embodiment of the invention in a rectangular waveguide configuration.
FIG. 4 is an iosmetric view, partly in section, of the embodiment of the invention in a coaxial waveguide configuration.

In FIG. 3 a rectangular waveguide configuration of the illustrative device is shown comprising a section of waveguide 30 having coaxial stubs 32 disposed along the propagation path. Within each caoxial stub the DC electrical bias is applied to diode device 34 by means of conductors 36 connected to a center conductor 38. To isolate the DC bias from the electromagnetic energy a noncontacting plunger-type movable short 40 is provided in each coaxial stub section. The input and output energy coupling means have been omitted in this illustration for the sake of clarity in an understanding of the embodiment.

In FIG. 4 coaxial waveguide 42 is shown with diodes 44 abutting the center conductor 46 of the coaxial line. The DC bias is again applied by means of coaxial center conductors 48 and electrical conductors 50. Electromagnetic energy isolation is again provided by noncontacting electrical short circuiting means 52.

Numerous other embodiments of the invention will readily occur to those skilled in the art, limited only by the foregoing considerations of negative-resistance biasing, negative propagation constant of the transmission structure and solid state diode devices maintained in the nonoscillating state. It is intended that all such modifications or variations be included in the spirit and scope of the invention as described and illustrated herein.

I claim:

1. An electromagnetic energy amplifier device comprising:
   - means defining a nonresonant energy transmission line having an input and output end;
   - solid state nonoscillating negative-resistance devices connected electrically in parallel at periodic intervals along said transmission line, the number of such devices increasing sequentially downstream toward said output end;
   - means for electrically biasing said solid state devices to provide said transmission line with a negative propagation constant; and
   - means providing for nonreciprocal transmission of energy and impedance matching coupled at intervals to said line.

2. An amplifier device according to claim 1 wherein said transmission line has a coaxial waveguide configuration.

3. An amplifier device according to claim 1 wherein said transmission line has a rectangular waveguide configuration.

4. An amplifier device according to claim 1 wherein said solid state devices comprise a bulk-effect diode.

5. An amplifier device according to claim 1 wherein said solid state devices comprise an avalanche type diode.

6. An amplifier device according to claim 1 wherein said nonreciprocal transmission means comprise a multi-port ferrimagnetic circulator.

* * * * *